United States Patent [19]

Ivers

[11] Patent Number: 5,671,043
[45] Date of Patent: Sep. 23, 1997

US005671043A

[54] OPTICAL POSITION DETECTOR FOR DETERMINING THE ANGULAR POSITION OF A ROTATABLE ELEMENT

[75] Inventor: Richard Ivers, West Newton, Mass.

[73] Assignee: Cambridge Technology, Inc., Cambridge, Mass.

[21] Appl. No.: 538,202

[22] Filed: Oct. 3, 1995

[51] Int. Cl.$^6$ ................................................. G01D 5/34
[52] U.S. Cl. ........................................ 356/138; 250/231.13
[58] Field of Search ................................ 356/138, 152.1; 250/231.13, 231.14

[56] References Cited

U.S. PATENT DOCUMENTS

| 4,056,722 | 11/1977 | Ray | ................. 250/231.13 |
| 4,864,295 | 9/1989 | Rohr . | |
| 5,235,180 | 8/1993 | Montagu . | |

FOREIGN PATENT DOCUMENTS 0030705   2/1988   Japan ........................... 250/231.13

OTHER PUBLICATIONS

Montagu, Jean and Bukys, Al, *Moving Magnet Galvanometer Scanners*, Technical Note Dec. 1992, Space Microdynamics and Accurate Control Symposium, Dec. 1, 1992.

*6800/CB6588 Mirror Positioning System* Instruction Manual, Cambridge Technology, Inc., Watertown, Mass. 1989 to Feb. 1, 1994.

*Primary Examiner*—Samuel A. Turner
*Attorney, Agent, or Firm*—Jacob N. Erlich

[57] ABSTRACT

An optical position detector for determining the angular position of a rotating element and being virtually insensitive to any unwanted radial movement of the rotating element. The position detector having a first light source and a second light source, each positioned proximate one end of the rotating element and positioned diametrically opposed from one another. Four light detectors are optically aligned with the first and second light sources for receiving light therefrom and for providing an output indicative of the amount of light received. An opaque flat element being interconnected to the one end of the rotating element for preventing a preselected amount of light emanating from the first and second light sources from being received by the light detectors. The first and second light sources and the light detectors cooperating with each other in such a manner that the output from the light detectors is virtually unaffected by any unwanted radial movement of the rotating element. The output from the light detectors is received by a circuit which provides a signal indicative of the angular position of the rotating element.

16 Claims, 7 Drawing Sheets

OPTICAL POSITION DETECTOR FOR DETERMINING THE ANGULAR POSITION OF A ROTATABLE ELEMENT

FIELD OF THE INVENTION

The present invention relates generally to devices capable of determining the angular position of a moving element and, more particularly, to an optical position detector which utilizes the sensing of light from a pair of light sources by a plurality of photocells in determining the angular position of a rotating element.

BACKGROUND OF THE INVENTION

Precision measurements of the rotary position of a rotating element, such as a shaft in a limited rotation motor, are often required as, for example, when using a rotating mirror to control the angular position of a laser light beam. There have been a number of different approaches used in the sensing and detecting of rotary motion. Many of these detectors are acceptable for some types of uses but have drawbacks associated therewith or are unsatisfactory for other types of uses.

Techniques using variable differential transformers have been found deficient because of their excessive sensitivity to the presence of magnetic fields. Variable potentiometers have been found to have excessive mechanical hysteresis characteristics and, particularly when used around the balanced, or zero, region of the angular position, are subject to oscillation or jitter, which has resulted in contact wear problems. Moreover, potentiometers tend to be subject to general problems of limited life due to their mechanical motions.

The capacitance sensing system, although capable of extreme accuracy requires an on-board oscillator circuit capable of producing excitation to the capacitor system. It is difficult to package this circuitry into a small space and consequently a substantially increased cost of manufacture results therefrom. Furthermore the moving dielectric butterfly member associated therewith has significant inertia, which becomes an increasingly larger contributor to total inertia in the smaller motor sizes. The moving plate capacitance sensor, which may have low inertia, suffers from a variety of other drawbacks including high sensitivity to radial shaft motion and high output drift with temperature.

Position detectors based on the use of light detection techniques also suffer from problems of temperature instability, e.g., drifts, with time. Light detection devices can be vibration sensitive and often produce substantially non-linear operations, even over relatively small ranges of rotary motion. Other optical devices, using optical encoders or a diffuser, which distribute light to an array of photocells as it rotates with the motor shaft, have problems related to high mechanical inertia, poor resolution and a large size leading to expensive manufacturing costs. The single light source/ two photocell optical position detector is sensitive to radial shaft motion. This factor is extremely important because of its effect on angular positioning repeatability. Even minor unwanted radial movement of the shaft can substantially adversely affect the accuracy of the detector's output.

It is therefore an object of this invention to provide a position detector which relies upon a pair of light sources and a plurality of light detectors to provide an increased output, low inertia, high accuracy rotary motion sensor.

It is a further object of this invention to provide an optical position detector which is virtually insensitive to undesirable radial shaft movement.

It is still another object of this invention to provide an optical position detector which is of small size, low power consumption and inexpensive to manufacture.

SUMMARY OF THE INVENTION

The present invention overcomes the problems associated with past position detectors by providing an optical position detector which has increased output and is no longer sensitive to radial shaft movement during the sensing of rotary movement of a shaft. The concept embodied by the present invention produces a highly accurate, low inertia, highly stable and repeatable position detecting system. The optical position detector of this invention is particularly useful and advantageous in smaller size optical scanners. Furthermore, although the present invention is designed specifically for optical scanners, it is also capable of providing accurate measurements in a variety of other limited-angular rotary positioning situations.

The present invention incorporates therein a vane, called a flag, attached to one end of a rotatable shaft. The opposite end of the shaft may contain, for example, a mirror. The vane or flag is made of a material such as light weight metal which is opaque, that is, does not permit the reflection of light therefrom. Located adjacent the flag are a pair of oppositely disposed light sources, preferably in the form of light emitting diodes. Interposed between the light emitting diodes are four photocells. Each of the light sources has a pair of baffles associated therewith to obviate the problem of stray light striking the photocells. The flag is sized such that its length in the axial direction is greater then the axial length of the active region of each of the photocells. Further, the geometrical design of the flag enables the edges of the flag to define shadows which cover about one-half of each photocell when the shaft is in its zero or null position.

As the flag rotates or oscillates the shadows move across the surfaces of the four photocells. For each given amount of flag rotation two diagonally located photocells receive increasing amounts of light (that is, less shadow) while the opposite two diagonal cells receive decreasing amounts of light. The output of the photocells is a current proportional to the total radiant power of light falling on their active surfaces. Radiant power is intensity times area, so that with constant intensity, the cell output is proportional to the area exposed to light.

These factors are calculated mathematically and in practice the position detector of the present invention has an ideal linearity which deviates from its theoretical output by an error of less than 1% for an angular rotation of less than twenty (20) degrees. Such an error factor is satisfactory for utilization of the present invention in small end size ranges of scanners because it is extremely effective in overcoming unwanted axial and linear or radial shaft motion, as well as simple to operate, has a low cost of manufacture and is insensitive to temperature variations.

The utilization of a pair of light sources in conjunction with four photocells in the position detector of the present invention enables the position detector to be virtually insensitive to undesirable radial shaft motion in either the x or y direction. The configuration of the flag negates sensitivity to unwanted axial shaft motion. In order to compensate for any drifts due to temperature and to compensate for any anticipated loss in light emitting diode output due to aging or other factors, an automatic gain control circuit is also incorporated within the present invention.

For a better understanding of the present invention, together with other and further objects, reference is made to the following description taken in conjunction with the accompanying drawings, and its scope will be pointed out in the appended claims.

DETAILED DESCRIPTION OF THE PREFERRED EMBODIMENT

Figure 2:
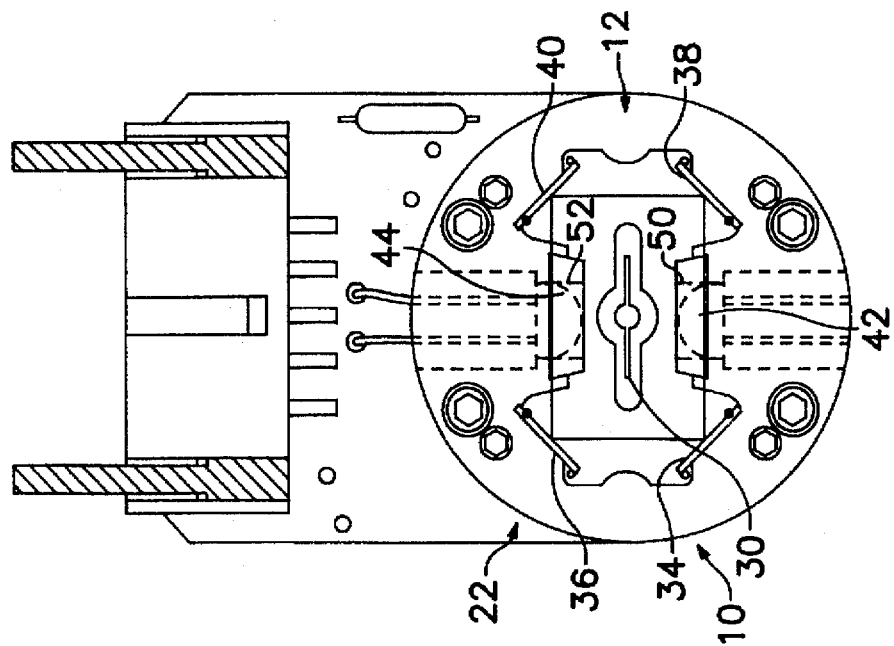
FIG. 2 is a front view of the moving magnet scanner of FIG. 1 having the optical position detector of this invention therein and taken along line II—II of FIG. 1.
Figure 1:
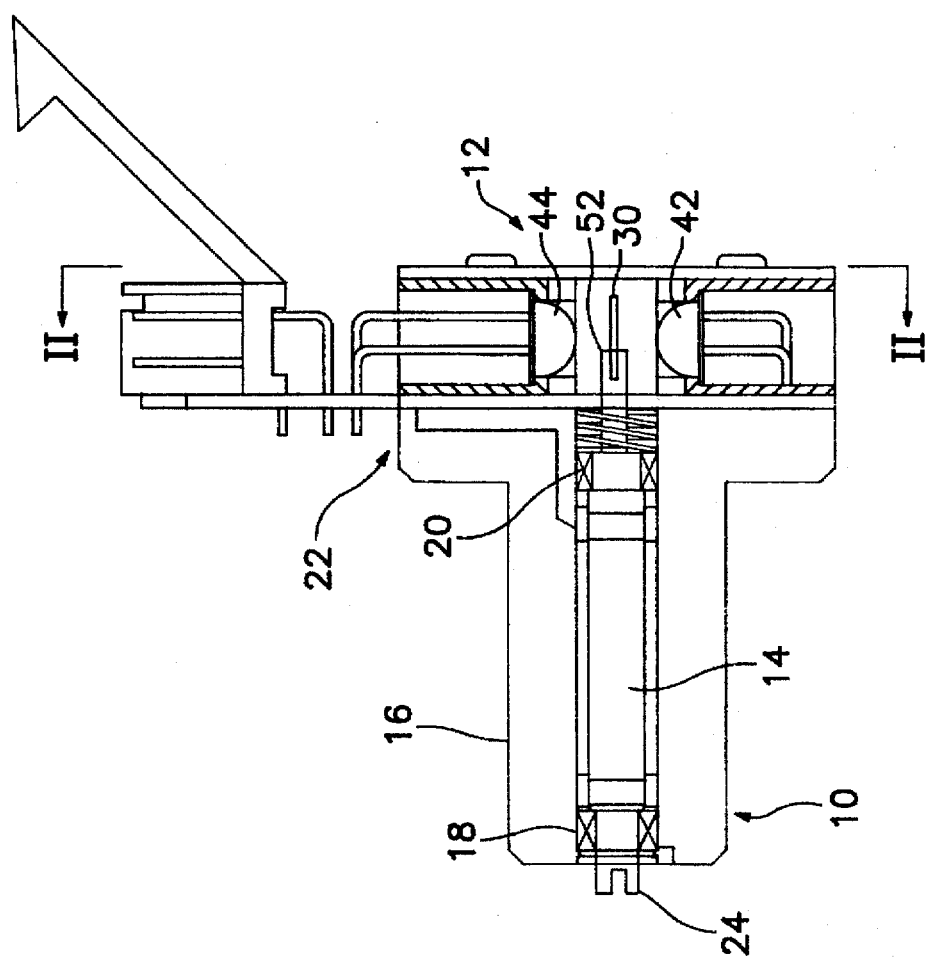
FIG. 1 is a cross sectional view of a moving magnet scanner having the optical position detector of the present invention incorporated therein.

Reference is now made to FIGS. 1 and 2 of the drawings which depict a rotational device such as a moving magnet scanner 10 which incorporates therein the optical position detector 12 of this invention. Although the optical position detector 12 of the present invention is described with respect to moving magnet scanner 10, it should be realized that this invention is capable of being incorporated in and utilized with any device capable of detecting or sensing rotational or oscillational motion.

More specifically, the moving magnet scanner 10 includes a rotatable shaft or shaft assembly 14 mounted for rotational or oscillational movement within a coil housing 16 by a pair of bearings 18 and 20. Since the exact details of the moving magnet scanner 10 is not required for an understanding of the optical position detector 12 of the present invention, no further description of the remaining components thereof are necessary.

Still referring to FIGS. 1 and 2 of the drawings, the optical position detector 10 of this invention is positioned adjacent one end 22 of the moving magnet scanner 10 while the other end 24 thereof may have attached thereto a mirror (not shown). The mirror can be attached directly to the end 24 of shaft 14, and it is the rotational movement or oscillational movement of this mirror which is detected or sensed by the present invention. The remaining description will use the term rotation, rotational, oscillation and oscillational interchangeably to represent both rotational or oscillational movement of shaft 14. More specifically, the terms rotation, rotational, rotary, and rotatable define both complete rotary motion or partial rotary motion, i.e. oscillation or oscillatory motion.

Figure 3:
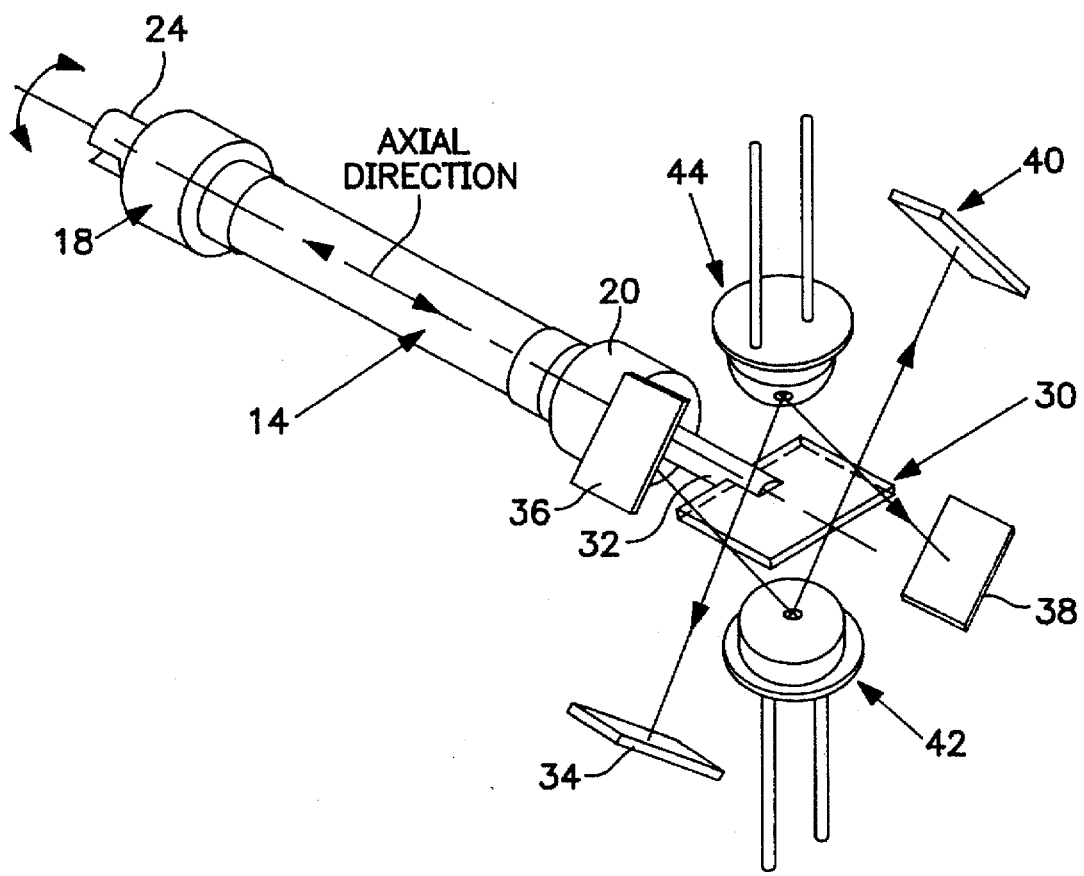
FIG. 3 is a pictorial view of the optical position detector of the present invention shown in exploded fashion.

Referring now to FIGS. 1–3 of the drawings, the various components of the optical position detector 10 of the present invention are explained in greater detail. As clearly shown in those Figures, a thin vane 30 is attached to end 32 of shaft assembly 14 proximate end 22 of moving magnet scanner 10. Vane 30 is preferably made of a thin metal material which is painted or manufactured opaque. This metal vane 30 will hereinafter also be referred to as flag 30. Its exact dimensions may vary within the scope of the invention, however, as shown in the drawings it is generally of a rectangular configuration. For reasons which will be set forth hereinafter, the length of flag 30 in the axial direction of shaft 14 must be greater in size then the axial length of the active region of each of the photocells or photodetectors 34, 36, 38, and 40. The particular size configuration of flag 30 substantially negates any sensitivity of the optical position detector 12 to undesirable axial shaft motion Still referring to FIGS. 1–3 of the drawings, the optical position detector 12 of this invention further includes first and second light sources 42 and 44. Light sources 42 and 44 are diametrically opposed, one from the other, having flag 30 evenly spaced therebetween. Each of the light sources 42 and 44 may be in the form of a conventional light emitting diode (LED), specifically chosen to have a uniform radiation pattern. This condition can be satisfied, for example, by the L2690 LED, whose relative radiant intensity varies very little as a function of emission angle.

Also, illustrated in the above-mentioned Figures are four photodetectors or photocells 34, 36, 38 and 40. They are positioned about flag 10 in such a manner as to circumscribe light sources 42 and 44. As illustrated therein, each pair of the four photocells are diagonally opposed and equally-spaced, one from the other. Also, a mechanism to prevent stray light from reaching the photocells must be positioned adjacent to or incorporated within the light sources 42 and 44. One such mechanism which can be utilized with the present invention, and clearly shown in FIGS. 2 and 4, would be opaque baffles 50 and 52, positioned adjacent light sources 42 and 44, respectively.

Figure 4:
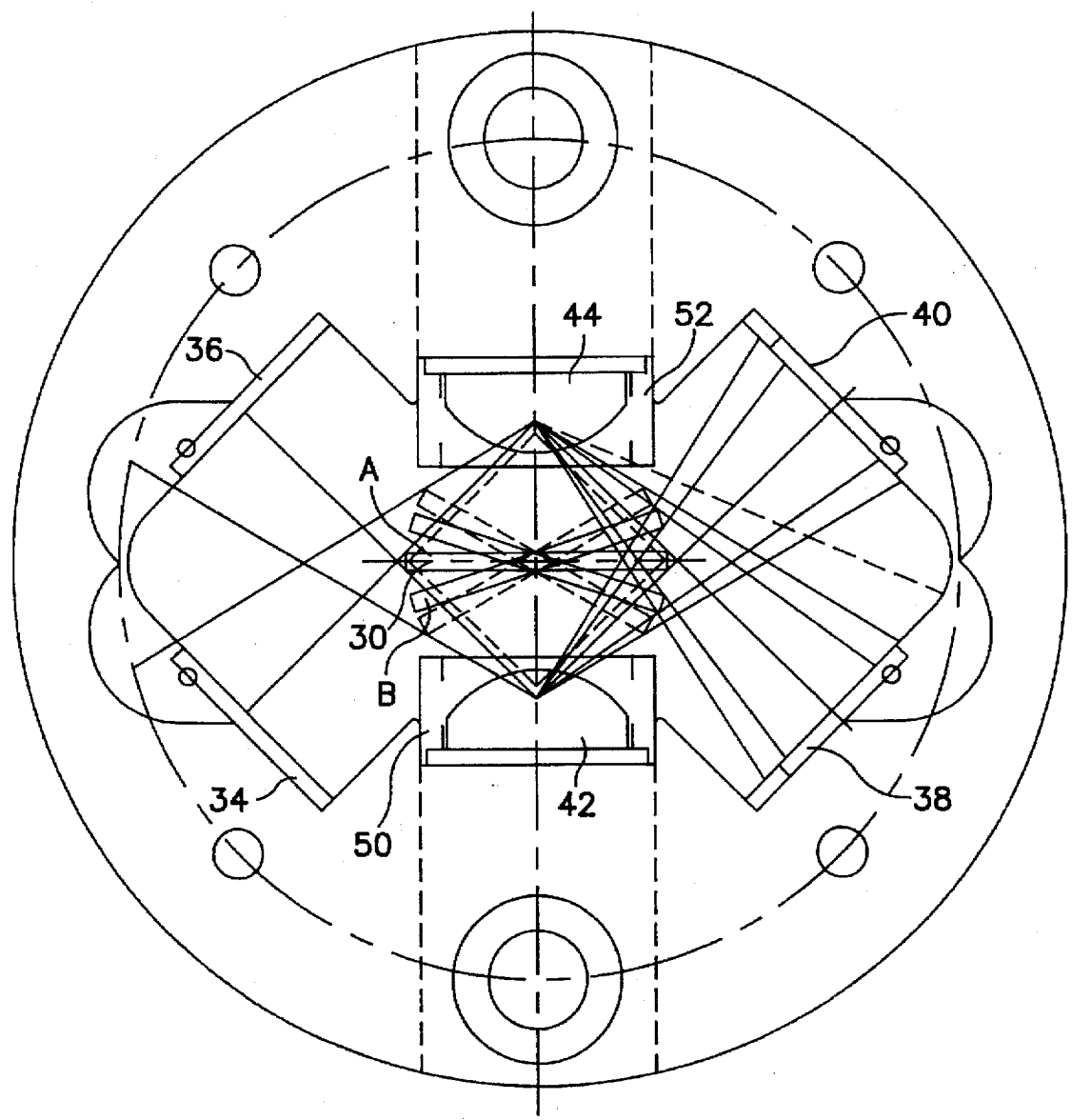
FIG. 4 is a geometrical shadow diagram of the optical position detector of this invention depicting the shadows falling upon the photocells during the rotational movement of the shaft.

Baffles 50 and 52 prevent light from reaching the wrong photocell. For example, as shown in FIG. 4, LED 42 illuminates only photocells 36 and 40. Barrier 50 prevents light from LED 42 from reaching photocells 34 and 38. These barriers, together with the opaqueness of flag 30 are crucial to the optimum operation of the position detector of the present invention. The amount of light falling on each of the photocells 34, 36, 38 and 40 are therefore determined by the rotational position of the flag 30. The rotational position of flag 30 corresponds to the rotational position of shaft 14 and any object which may be attached thereto.

As shown in the geometrical shadow diagram of FIG. 4, flag 30 rotates or oscillates with the shaft assembly 14 through a limited angular degree of rotation. This rotation usually is in the form of an extremely fast oscillation. As this oscillation or rotation takes place opaque flag 30 cuts off a portion of the light emanating from the pair of light sources 42 and 44. The unique geometry of the present invention, which incorporates therein two light sources 42 and 44 and four photodetectors or photocells 34, 36, 38, and 40 to receive the light therefrom, is arranged in such a manner that the edges of the flag 30 define shad, cover about one-half of each photocell 34, 36, 38 and 40 when the shaft is in its zero or null position as shown in FIGS. 1 and 2 of the drawings.

As the flag 30 rotates as shown in FIG. 4 of the drawings, the shadows move across the surfaces of the four photocells 34, 36, 38 and 40. For a given amount of flag rotation, as, for example, from position A to position B as shown in FIG. 4, two diagonally located photocells, exemplified by 34 and 40, receive increasing amounts of light, that is, less shadow, while the opposite two diagonal photocells, exemplified by 36 and 38, receive less light or more shadow. This rotational movement of flag 30 and its associated shadows on the photocells are geometrically shown in FIGS. 4 and 5 of the drawings. It is critical in the operation of the present invention that light which strikes the flag 30 be absorbed rather than reflected. Therefore, it essential that the flag be made opaque by, for example, painting with a high absorbent coating, to assure that no reflections take place. Reflected light would create a false input to the photocells and would negate the production of an accurate output signal. Likewise, barriers 50 and 52 prevent light from reaching the wrong photocell.

Photocells 34, 36, 38 and 40 produce an output current proportional to the total radiant power which fall upon their active surfaces. Radiant power is defined as intensity(I) x area(A), so in the case of the present invention, with constant intensity, the cell output is proportional to the area exposed to light. A mathematical analysis is provided below, with respect to the geometrical diagram of FIG. 5 of the drawings, defining the relationship between the length(x) of the shadow on each photocell as it varies with the angle(O) of rotation of flag 30.

Given:

$r=d_1$;

$x=0$ when $\theta=0$ $\theta$ is positive (+) for ccw rotation of flag 30;

Therefore:

$b_2=d_1-b_1$ $b_1=r \sin\theta$ $b_3=r \cos\theta$ $\omega=\tan^{-1} b_2/b_3$ $\alpha=\tan^{-1} d_1/r=\pi/4$ for this case where $r=d_1$ By inspection:

$\omega+\phi+\pi/4=\pi/2$

Hence:

$\phi=\pi/4-\omega$

Figure 5:
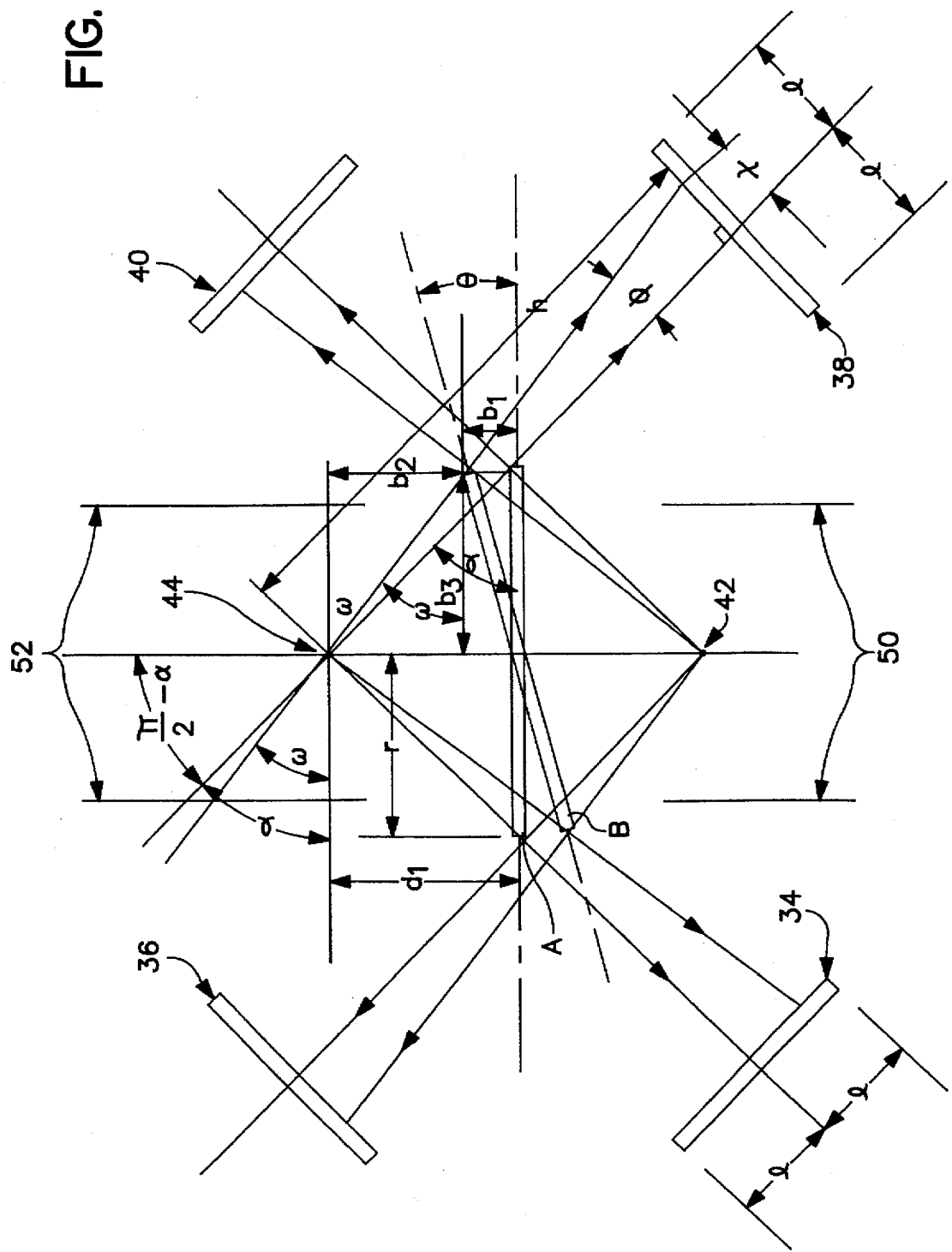
FIG. 5 is a geometrical diagram representative of the rotational movement of the optical position detector of the present invention.
Figure 8:
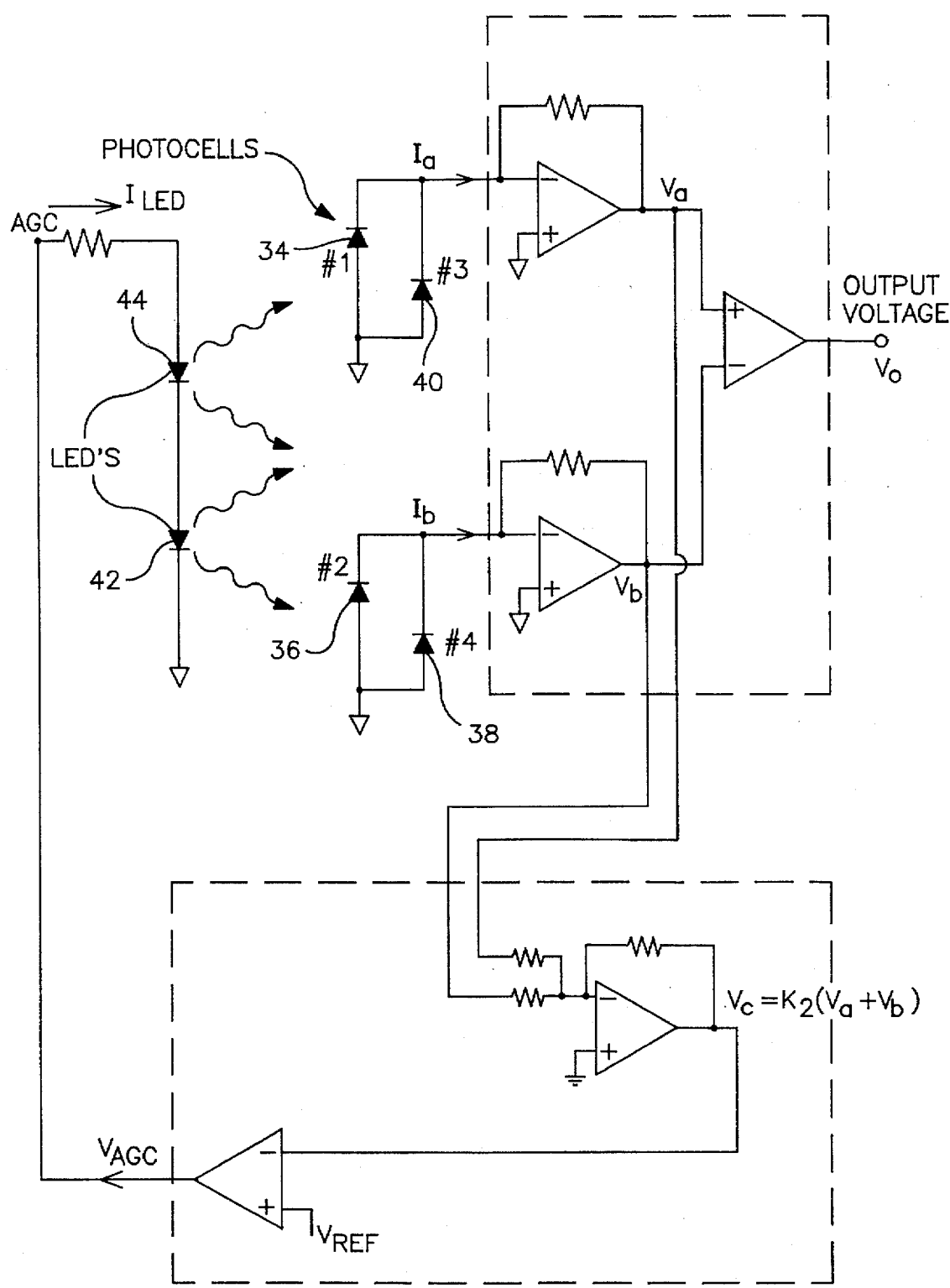
FIG. 8 is a circuit diagram of the measurement circuit utilized with the optical position detector of the present invention.

Now:

$$x = h \tan \phi = h \tan \left[ \pi/4 - \tan^{-1} \frac{(d_1 - r\sin\theta)}{r\cos\theta} \right]$$

Wherein the terms of the expression are defined as follows:

x=the length of the shadow which falls on the photocell;

θ=the angle of rotation of flag;

$d_1$=the distance from the light source to the center of the flag;

r=the radius of the flag; and

φ=the angle of shadow x h=the distance from the light source to the center of the photocell More specifically, referring to FIG. 5, when flag 30 is in the zero or null position each photocell is half illuminated and half in shadow. This is designated by the lengths marked 1. As the flag rotates through angle θ the shadow length on cell 38 increases by x. Because of the symmetrical geometry, the shadow length on cell 36 also increases by x. Simultaneously, the shadow lengths on cells 34 and 40 are decreasing. Therefore, the output currents from photocells 34 and 40 go up while the currents from photocells 36 and 38 are going down. These pairs of photocell currents are summed as shown in the circuit of FIG. 8, then wired into opposite sides of a differential amplifier to produce the final output. The mathematical derivation set forth above is intended to illustrate the basic linearity of the invention. Output is related to shadow lengths which are in turn a function of shaft angle, For angles of rotation of less than 20 degrees, the deviation, with the present invention, from ideal linearity does not exceed 1%.

Figure 6:
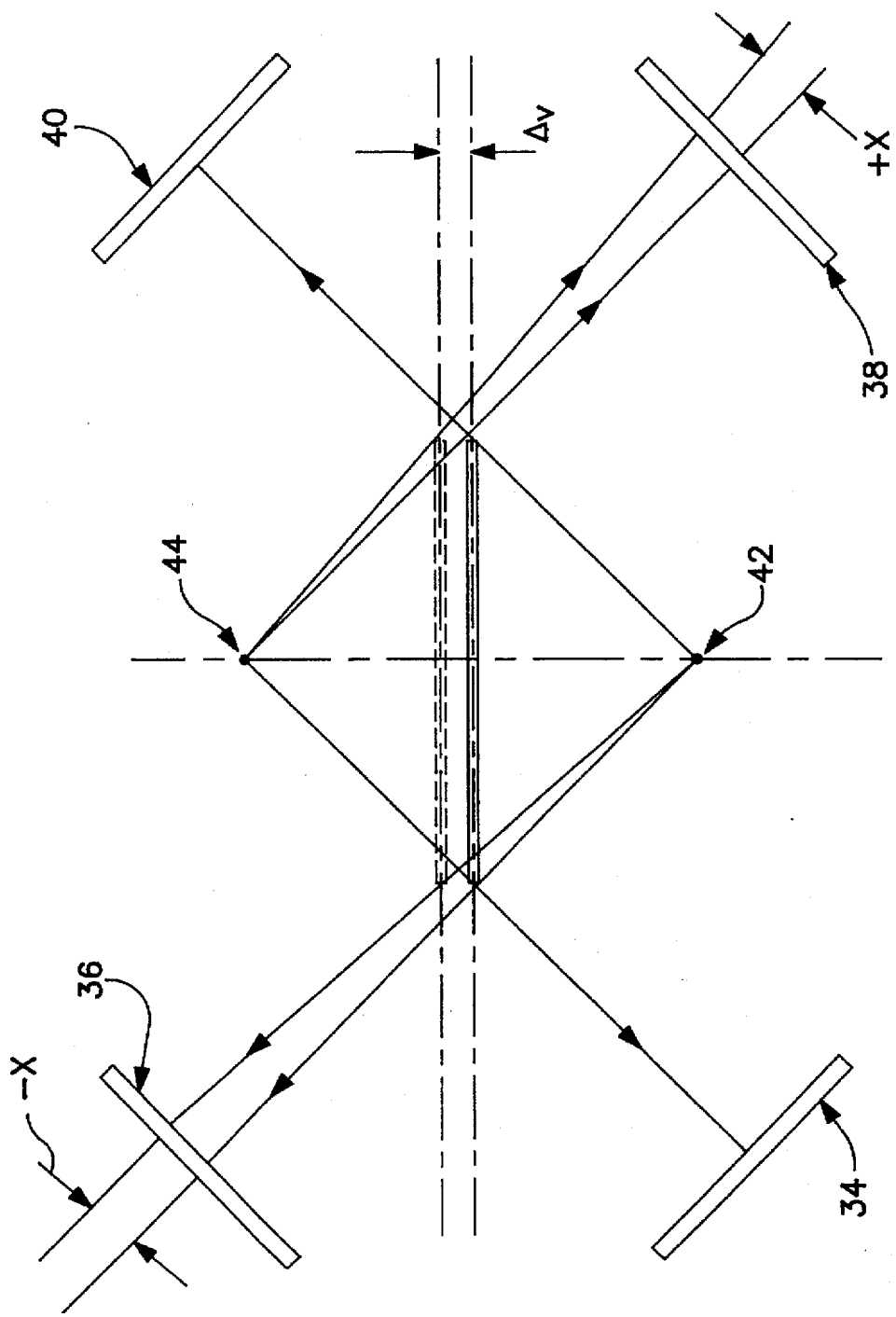
FIG. 6 is a geometrical diagram representative of the optical position detector of the present invention illustrating its insensitivity to unwanted radial movement in the vertical direction.
Figure 7:
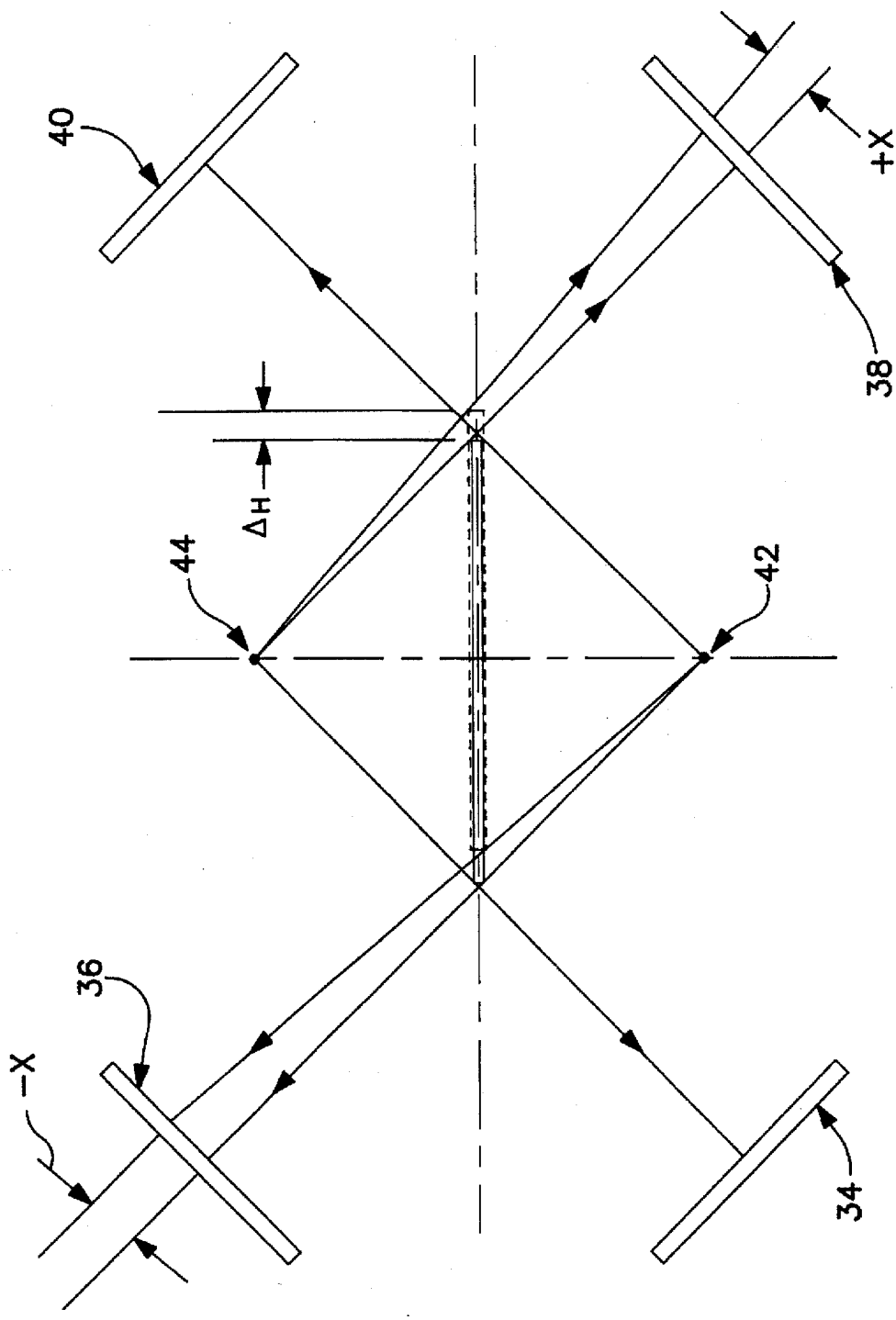
FIG. 7 is a geometrical diagram representative of the optical position detector of the present invention illustrating its insensitivity to unwanted radial movement in the horizontal direction.

Reference is now made to FIGS. 6 and 7 of the drawings which are used to illustrate how the position detector 12 of the present invention compensates for radial shaft movement and, therefore, is virtually insensitive to the undesirable radial shaft movement in the vertical or horizontal direction. In FIG. 6, flag 30 is shown displaced in the vertical direction a distance Δv. This causes the shadow on cell 38 to increase, while the shadow length on cell 36 decreases by the same amount. Since cells 36 and 38 are summed together as shown in FIG. 8, the net effect is no change in total photocurrent coming from the pair. Photocells 34 and 40 act in the same way. There is no net change in total photocurrent.

FIG. 7 shows a similar action for the case of an unwanted horizontal radial displacement Δh of flag 30. As shown in FIG. 7, the movement delta h produces canceling changes in photocell output.

As shown in the circuit diagram of FIG. 8, the photocell currents $I_a$ and $I_b$ are collected together and then converted to a final output voltage $V_o$ which is virtually unaffected by any undesirable radially movement of shaft 14. The current $I_a$ is the sum of $I_1+I_3$ (photocells 34 and 40) and current $I_b$ is $I_2+I_4$ (photocells 36 and 38). Currents $I_a$ and $I_b$ pass out of the pickoff to an external circuitry. The final output $V_o$ represents the angle of rotation of shaft 14 where $V_o=k_1(I_a-I_b)$. As pointed out above, by configuring the position detector 12 of the present invention to incorporate therein a pair of light sources 42 and 44 and four photocells 34, 36, 38 and 40, the present invention is virtually insensitive to unwanted radial shaft motion since as the flag moves radial, in either the x or y direction, the diagonally connected photocells receive changing amounts of exposure to light. The changes are in opposite directions, so that the overall summed output current remains unchanged. This happens equally for both diagonally connected pairs. The net result is no change in output equivalent to angular rotation.

In order to compensate for any drifts due to temperature and anticipated loss in light efficiency output due to aging, for example, an automatic gain control circuit (AGC) is utilized within the optical position detector of the present invention. This AGC circuit is also illustrated in FIG. 8 of the drawings. Within the AGC circuit the principal of operation is as follows:

$V_{ref}$ is a stable reference whose value is chosen to give a desired photocell excitation current; and $V_c$ is a voltage proportional to the sum of currents $I_a$ and $I_b$.

If currents $I_a$ and $I_b$ drift, due to temperature or other causes, then the negative feedback action of the circuit causes an automatic adjustment in $V_{AGC}$ and the automatic gain control voltage restabilizes $I_a$ and $I_b$ back to their normal summed value. The overall result the photocell output current, per unit of exposed area, remains constant.

Although the invention has been described with reference to particular embodiments, it will be understood that this invention is also capable of further and other embodiments within the spirit and scope of the appended claims.

What is claimed is:

1. A position detection system for determining the angular position of a rotatable element extending in an axial direction, said system comprising:

a first light source and a second light source, each positioned proximate one end of the rotatable element;

detecting means optically aligned with said first and second light sources for receiving light therefrom and for providing an output indicative of the amount of light received by said detecting means from said light sources;

means connected to said one end of the rotatable element for preventing a preselected amount of light emanating from said first and second light sources from being received by said detecting means;

said detecting means comprising four light detecting components, a first pair of said light detecting components being operably interrelated with said first and second light sources and a second pair of said light detecting components being operably interrelated with said first and second light sources, whereby said output of said detecting means is virtually unaffected by any unwanted radial movement of the rotatable element;

said means for preventing a preselected amount of light from being received by said detecting means comprising an opaque element extending in said axial direction from the rotatable element and being interposed between said first and second light sources and said four light detecting components; and means for receiving said output from said detecting means and providing a signal indicative of the angular position of the rotatable element.

2. A position detection system as defined in claim 1 further comprising means cooperating with said first and second light sources for preventing unwanted light emanating therefrom from reaching said first and second pair of light detecting components.

3. A position detection system as defined in claim 2 wherein each of said light detecting components has an active region extending in length in said axial direction, and said opaque element is greater in length in said axial direction than said length of said active region of each of said light detecting components, whereby said output from said detecting means is virtually unaffected by any unwanted axial movement of the rotatable element.

4. A position detection system as defined in claim 2 wherein said first and second light sources are diametrically opposed from each other.

5. A position detection system as defined in claim 1 wherein said first and second light sources each produce a substantially uniform radiation pattern.

6. A position detection system as defined in claim 1 wherein each of said light detecting components has an active region extending in length in said axial direction, and said opaque element is greater in length in said axial direction than said length of said active region of each of said light detecting components, whereby said output from said detecting means is virtually unaffected by any unwanted axial movement of the rotatable element.

7. A position detection system as defined in claim 6 wherein the radial length of said opaque element is such that when said opaque element is in a horizontal position half of the active region of each light detecting component receives light from said light sources.

8. A position detection system as defined in claim 1 wherein said means for providing a signal indicative of the angular position of the rotatable element comprises a current-to-voltage converter circuit having automatic gain control circuitry electrically connected therewith.

9. A position detection system as defined in claim 8 wherein said of said light detecting components produce a current indicative of the amount of light received and the current from said first pair of light detecting components are summed together and the current from said second pair of light detecting components are summed together in said current-to voltage converter circuit.

10. A position detection system as defined in claim 1 wherein said first and second light sources are diametrically opposed from each other.

11. A position detection system as defined in claim 10 wherein said light detecting components making up said first pair of light detecting components are diagonally opposed from each other and wherein said light detecting components making up said second pair of light detecting components are diagonally opposed from each other.

12. A position detection system as defined in claim 11 further comprising means cooperating with said first and second light sources for preventing unwanted light emanating therefrom from reaching said first and second pair of light detecting components.

13. A position detection system for determining the angular position of a rotatable element extending in an axial direction, said system comprising:

a first light source and a second light source, each positioned proximate one end of the rotatable element and positioned diametrically opposed from one another;

four light detectors optically aligned with said first and second light sources for receiving light therefrom and for providing an output indicative of the amount of light received;

said four light detectors being in the form of two pairs of light detectors operably interrelated with one another;

an opaque flat element connected to said one end of the rotating element and extending in said axial direction from said rotatable element for preventing a preselected amount of light emanating from said first and second light sources from being received by said two pair of light detectors;

an opaque baffle surrounding each of said light sources for preventing unwanted light from striking said light detectors;

a first pair of said two pair of light detectors being operably interrelated with said first and second light sources and a second pair of said two pair of said light detectors being operably interrelated with said first and second light sources, whereby said output of said detecting means is virtually unaffected by any unwanted radial movement of the rotatable element; and means for receiving said output from said light detectors and providing a signal indicative of the angular position of said rotating element.

14. A position detection system as defined in claim 13 wherein the amount of shadow, x, cast on said light detector is defined by the following expression:

$$X = h \tan \phi = h \tan [\pi/4 - \tan^{-1}(d_1 - r \sin \theta / r \cos \theta)]$$

Wherein the terms of the expression are defined as follows:

wherein the terms of the expression are defined as follows:
x = the length of the shadow which falls on the light detector,
θ = the angle of rotation of flat element,
$d_1$ = the distance from the light source to the center of the element,
r = the radial length of the element,
h = the distance from the light source to the light detector.

15. A position detection system as defined in claim 14 wherein each of said light sources is a light emitting diode which produces a substantially uniform radiation pattern.

16. A position detection system as defined in claim 15 wherein the radial length of said opaque element is such that when said opaque element is in a horizontal position half of the active region of each light detector receives light from said light emitting diodes and the other half is in said shadow.

* * * * *